(12) United States Patent
Kim et al.

(10) Patent No.: US 10,341,056 B2
(45) Date of Patent: Jul. 2, 2019

(54) DECODING APPARATUS AND METHOD IN MOBILE COMMUNICATION SYSTEM USING NON-BINARY LOW-DENSITY PARITY-CHECK CODE

(71) Applicant: Samsung Electronics Co., Ltd, Gyeonggi-do (KR)

(72) Inventors: Sang-Min Kim, Uiwang-si (KR); Woo-Myoung Park, Suwon-si (KR); Seok-Ki Ahn, Suwon-si (KR); Chi-Woo Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 401 days.

(21) Appl. No.: 14/671,961

(22) Filed: Mar. 27, 2015

(65) Prior Publication Data

US 2015/0280744 A1    Oct. 1, 2015

(30) Foreign Application Priority Data

Mar. 27, 2014  (KR) .......................... 10-2014-0036134

(51) Int. Cl.
| | |
|---|---|
| *H03M 13/00* | (2006.01) |
| *H04L 1/16* | (2006.01) |
| *H03M 13/11* | (2006.01) |
| *H04L 1/18* | (2006.01) |

(52) U.S. Cl.
CPC ....... *H04L 1/1607* (2013.01); *H03M 13/1111* (2013.01); *H03M 13/1171* (2013.01); *H03M 13/6502* (2013.01); *H03M 13/6577* (2013.01); *H03M 13/6588* (2013.01); *H04L 1/1812* (2013.01)

(58) Field of Classification Search
CPC .......... G06F 11/00; G06F 11/10; G06F 12/02; H03M 13/00; H03M 13/11; H03M 13/1111; H03M 13/1131; H03M 13/1171; H03M 13/6502; H03M 13/6577; H03M 13/6588; H04L 1/16; H04L 1/1607; H04L 1/1812
USPC ....................................................... 714/758
See application file for complete search history.

(56) References Cited

U.S. PATENT DOCUMENTS

| | | | |
|---|---|---|---|
| 8,347,191 B1 * | 1/2013 | Ran .................. | E04C 2/044 714/784 |
| 8,918,704 B2 | 12/2014 | Declercq et al. | |
| 9,048,874 B2 * | 6/2015 | Wang ................. | H03M 13/13 |
| 2004/0153960 A1 * | 8/2004 | Eroz .................. | H03M 13/11 714/800 |
| 2007/0226585 A1 * | 9/2007 | Park .................. | H03M 13/1111 714/758 |
| 2009/0063930 A1 * | 3/2009 | Matsumoto ........ | H03M 13/1102 714/752 |

(Continued)

*Primary Examiner* — Albert Decady
*Assistant Examiner* — Enamul M Kabir

(57) ABSTRACT

A decoding method in a mobile communication system using a non-binary LDPC code according to various embodiments of the present disclosure includes: selecting a message value having the highest reliability from each column and each row of an input vector message; generating a configuration set using the message value selected for each column and a GF element corresponding to the message value; and generating a check node output message using the generated configuration set and an extra output message value. According to various embodiments of the present disclosure, a decoding time period is reduced.

20 Claims, 12 Drawing Sheets

(56) References Cited

U.S. PATENT DOCUMENTS

| | | | |
|---|---|---|---|
| 2009/0249159 A1* | 10/2009 | Lee | H03M 13/1148 |
| | | | 714/752 |
| 2012/0005551 A1* | 1/2012 | Gunnam | H03M 13/1108 |
| | | | 714/752 |
| 2013/0058305 A1* | 3/2013 | Jang | H04L 1/0071 |
| | | | 370/329 |
| 2013/0246894 A1* | 9/2013 | Declercq | H03M 13/256 |
| | | | 714/792 |

* cited by examiner

|   GF(q) element | Input Vector Messages | | |
|---|---|---|---|
| | V1 | V2 | V3 |
| 0 | 0 | 0 | 0 | ~ 510
| 1 | 5 | 30 | 40 |
| $\alpha^1$ | 10 | 20 | 20 |
| $\alpha^2$ | 15 | 4 | 10 |

FIG.5A

| | Input Vector Messages | | |
|---|---|---|---|
| | V1 | V2 | V3 |
| 0 | [0] | [0] | [0] | ~ 520
| 1 | [5] | [30] | 40 |
| $\alpha^1$ | [10] | [20] | 20 |
| $\alpha^2$ | 15 | [4] | [10] |

FIG.5B

GF(q) element   Extra column output $$\begin{array}{c} 0 \\ 1 \\ \alpha^1 \\ \alpha^2 \end{array} \begin{bmatrix} 0 \\ 5 \\ 6 \\ 4 \end{bmatrix}$$

FIG. 7D

Check node output $$\begin{array}{c} 0 \\ 1 \\ \alpha^1 \\ \alpha^2 \end{array} \begin{bmatrix} 0 \\ \mathbf{10} \\ 6 \\ 4 \end{bmatrix} \begin{bmatrix} 0 \\ 5 \\ 6 \\ \mathbf{10} \end{bmatrix} \begin{bmatrix} 0 \\ 5 \\ \mathbf{9} \\ 4 \end{bmatrix} \begin{bmatrix} 0 \\ 5 \\ 6 \\ 4 \end{bmatrix}$$

FIG. 7E

DECODING APPARATUS AND METHOD IN MOBILE COMMUNICATION SYSTEM USING NON-BINARY LOW-DENSITY PARITY-CHECK CODE

CROSS-REFERENCE TO RELATED APPLICATION AND CLAIM OF PRIORITY

The present application is related to and claims the priority under 35 U.S.C. § 119(a) to Korean Application Serial No. 10-2014-0036134, which was filed in the Korean Intellectual Property Office on Mar. 27, 2014, the entire content of which is hereby incorporated by reference.

TECHNICAL FIELD

The present disclosure relates to a decoding apparatus and method in a mobile communication system using a non-binary Low-Density Parity-Check (LDPC) code.

BACKGROUND

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier(FBMC), non-orthogonal multiple access (NOMA), sparse code multiple access (SCMA), and Low-Density Parity-Check (LDPC) coding as an advanced access technology have been developed.

In general, in a mobile communication system, an encoder and a decoder are used to correct an error of a forward channel. In such a mobile communication system, since data is transmitted and received in a wireless environment, a convolutional code, which is a Trellis code, a Reed-Solomon (R-S) code, which is a linear block code, etc., are used as a code for effectively correcting an error of noise generated in a transmission channel so as to improve reliability of data transmission. In 1993, a turbo coding and repeated decoding method having error correction ability close to the theoretical limit of Shannon has been introduced by Berrou. The repeated decoding method can ensure communication having higher reliability than that of the previously-used convolutional coding method.

SUMMARY

To address the above-discussed deficiencies, it is a primary object to provide a decoding apparatus and method that selectively uses a check node output message of message values corresponding to a configuration set.

The present disclosure provides a decoding apparatus and method that improve error correction ability and have a low-complexity decoder.

The present disclosure provides a decoding apparatus and method that previously determine a decoding failure decision (early-stop decision) with respect to a frame (or a packet) having a high failure probability before the maximum number of times of repeated decoding, thereby reducing decoding time.

A decoding method in a mobile communication system using a non-binary LDPC code includes: selecting a message value having the highest reliability from each column and each row of an input vector message; generating a configuration set using the message value selected for each column and a galois field (GF) element corresponding to the message value; and generating a check node output message using the generated configuration set and an extra output message value.

A decoding apparatus in a mobile communication system using a non-binary LDPC code includes: a message conversion unit that selects a message value having the highest reliability from each column of an input vector message; a message selection unit that generates a configuration set using the message value selected for each column and a GF element corresponding to the message value; and a check node output message generation unit that generates a check node output message using the generated configuration set and an extra output message value.

The present disclosure selectively uses a check node output message of message values corresponding to a configuration set.

The present disclosure improves error correction ability and provides a low-complexity of a decoder.

The present disclosure previously determines a decoding failure decision (early-stop decision) with respect to a frame (or a packet) having a high failure probability before the maximum number of times of repeated decoding, thereby reducing decoding time.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 5A and 5B illustrate a process of selecting a node that configures a configuration set using a check node input message of a typical technology according to various embodiments of the present disclosure;

FIGS. 7A, 7B, 7C, 7D and 7E illustrate a method of correcting an error in a mobile communication system using a non-binary LDPC code according to various embodiments of the present disclosure;

DETAILED DESCRIPTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device.

Further, terms or words used in the description and claims below should not be interpreted as only general or dictionary meanings, but interpreted as meanings and concepts satisfying the technical spirit of the present disclosure based on a principle that the inventor appropriately define the disclosure with a concept of the terms in order to describe the disclosure in the best method.

Figure 1:
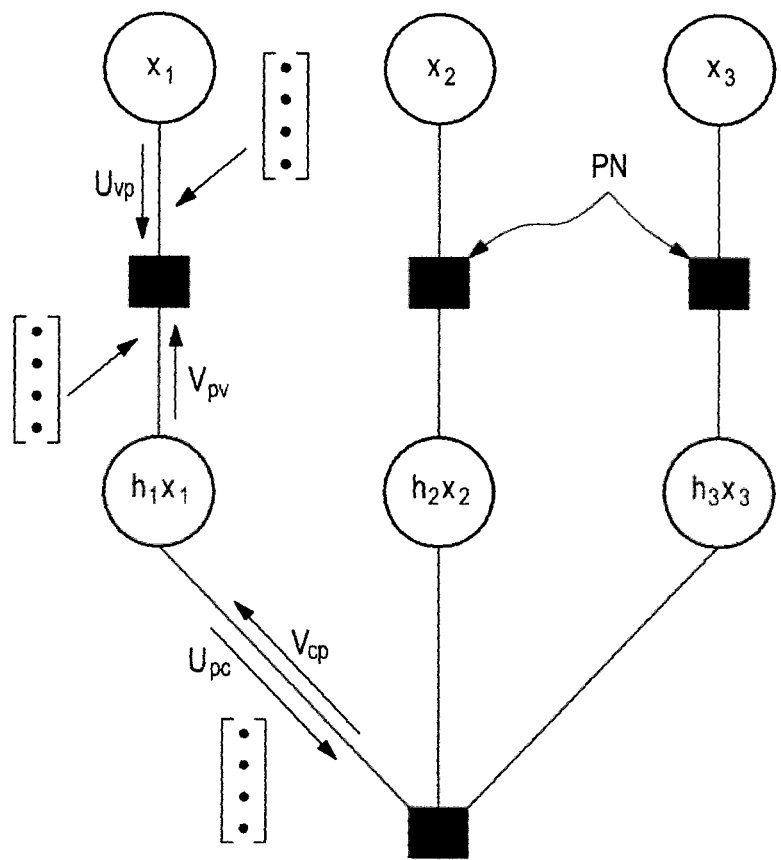
FIG. 1 illustrates an exemplary process of updating a message between a check node and a variable node of a non-binary LDPC code decoder according to various embodiments of the present disclosure.

FIG. 1 illustrates an exemplary process of updating a message between a check node and a variable node of a non-binary LDPC code decoder according to various embodiments of the present disclosure.

A check node of a decoder configures a configuration set using the first or second smallest values in a variable node output message (Variable-to-Check (V2C) message) within the number of check node degrees and calculates a check node output message (Check-to-Variable (C2V) message).

In a decoding algorithm of a non-binary LDPC code, a scheme of configuring a configuration set using the entirety of the variable node output message corresponds to a decoding algorithm method that is unsuitable for a decoder system requiring low complexity and low power since algorithm calculation complexity increases due to an excessive configuration set. A technology of configuring a configuration set using the entirety of a variable node output message is unsuitable for a receiver of a base station or a terminal that requires the next generation high speed data processing.

In order to solve the aforementioned problem, the present disclosure solves the following problem in order to obtain a function that cannot be provided by a transmitter and a receiver using non-binary LDPC coding or decoding, especially, a decoder of the receiver.

In order to solve a complexity problem of a check node, in various embodiments of the present disclosure, a configuration set is configured by selecting a vector message having a high reliability among check node input vector messages. Message values corresponding to the configured configuration set provide a function, which a decoder having a lower complexity than a general technology has, while being selectively used in a check node output message and maintaining an error correction ability of the general technology.

A general decoding technology uses a method of determining a decoding completion (such as decoding success, decoding failure, etc.) time point using parity-check equations or Cyclic Redundancy Checks (CRCs) within the maximum number of times of repeated decoding. Since the general technology determines decoding failure within the maximum number of times of repeated decoding, a decoding time period is increased at the time of decoding failure. The present disclosure provides an apparatus and method that previously determine a decoding failure decision (early-stop decision) with respect to a frame (or a packet) having a high failure probability before the maximum number of times of repeated decoding, thereby reducing a decoding time.

Figure 2:
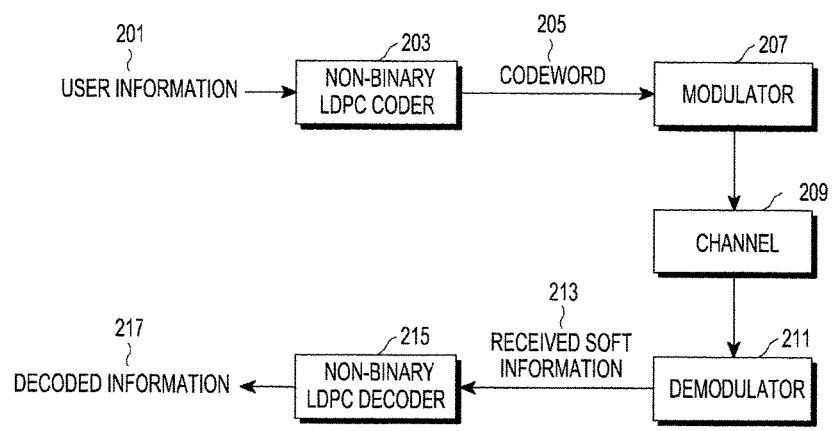
FIG. 2 illustrates a transmitter and a receiver including a non-binary LDPC code according to various embodiments of the present disclosure.

FIG. 2 illustrates a transmitter and a receiver including a non-binary LDPC code according to various embodiments of the present disclosure.

In the present specification, the Korean wording "Hang" and the English wording "row" are mixedly used and the Korean wording "Yeol" and the English wording "column" are mixedly used.

A non-binary LDPC encoder 203 generates a codeword 205 using a non-binary LDPC code in user data (or user information). The length of the codeword is determined according to the non-binary LDPC code. In general, the LDPC code is expressed in the form of an M×N parity-check matrix (referred to as "H matrix"). The length of the codeword is N (unit: symbol). The generated codeword 205 is transmitted to a modulator 207. The modulator 207 modulates a codeword 205 generated according to the modulation scheme (such as 16 Quadrature Amplitude Modulation (QAM), 64 QAM, Frequency Quadrature Amplitude Modulation (FQAM), etc.), and transmits the modulated codeword 205 to a demodulator 211 of a base station or a receiver through a channel 209. The demodulator 211 calculates soft information 213 of a message corresponding to the length N of a codeword in a message vector form and transmits the calculated result to a non-binary LDPC decoder 215.

For example, an LDPC code wherein GF(4)={0, 1, α, α2} and using QPSK modulation, the soft information 213 of the receiver is expressed as a vector value having a probability or a reliability having a message vector, i.e., a {Probability [0], Probability[1], Probability[α], Probability[α2]} form as follows. The received data having the received length N is configured by N message vectors including a first symbol {Probability[0], Probability[1], Probability[α], Probability [α2]}, a second symbol {Probability[0], Probability[1], Probability[α], Probability[α2]}, . . . , a Nth symbol {Probability[0], Probability[1], Probability[α], Probability[α2]} through the demodulator 211. The non-binary LDPC decoder 215 performs a decoding process of input of N message vectors and outputs a message having the length K=N−M. The message having the length K=N−M implies information 217 decoded in FIG. 3.

Figure 3:
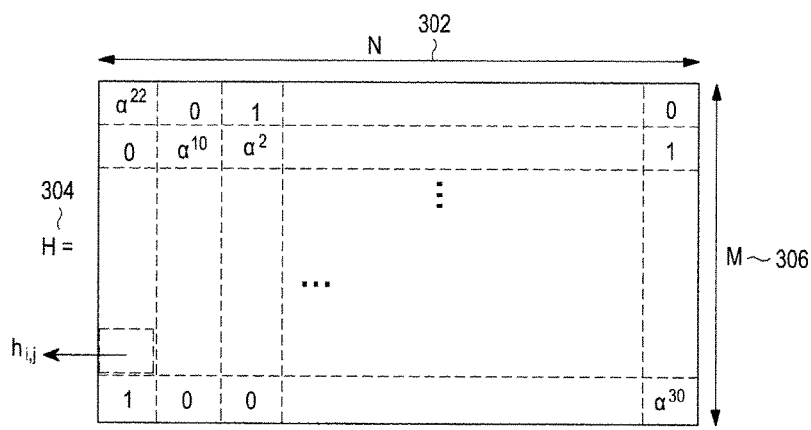
FIG. 3 illustrates a non-binary LDPC code in a case of GF 32 according to various embodiments of the present disclosure.

FIG. 3 illustrates a non-binary LDPC code in a case of GF 32 according to various embodiments of the present disclosure.

An encoder and a decoder are configured by a non-binary LDPC code, and the non-binary LDPC code is generally represented in a Parity-check matrix (H) 304. The size of the H 304 is M×N, N 302 denotes the length of a codeword, M 306 denotes the length of a parity (or a redundancy) or the number of parity symbols, and K denotes the length of user information wherein K=N−M. Elements of the H 304 are represented by a symbol element $h_{i,j}$={0, 1, α, αq−2} when a GF(q) non-binary LDPC code is determined.

Figure 4:
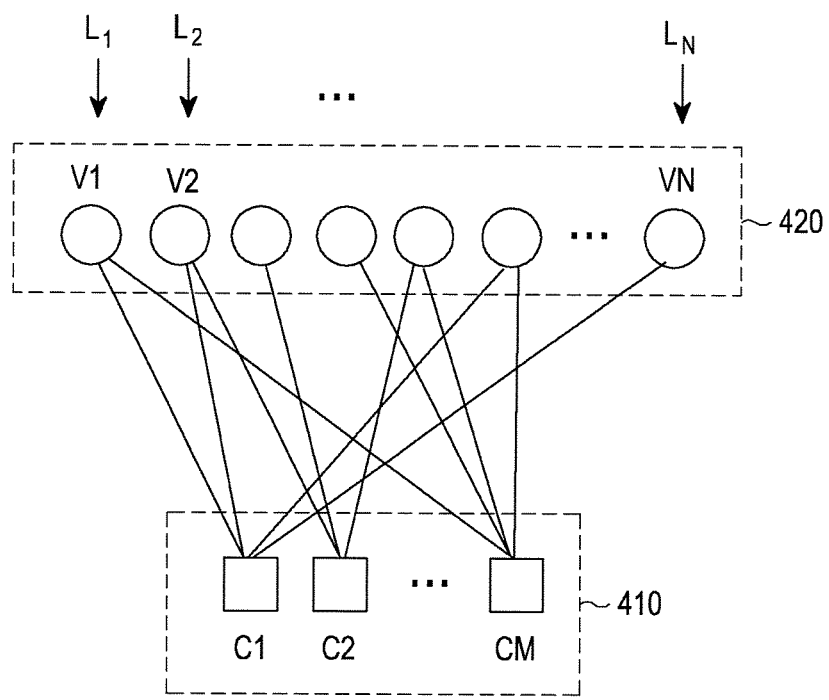
FIG. 4 illustrates a bipartite graph representation method corresponding to FIG. 3 according to various embodiments of the present disclosure.

FIG. 4 illustrates a bipartite graph representation method corresponding to FIG. 3 according to various embodiments of the present disclosure.

In FIG. 4, a part corresponding to a row in the H-matrix of FIG. 3 is configured by check nodes C1, C2, . . . , CM 410, a part corresponding to a column is configured by variable nodes V1, V2, VM 420, and a part not having a value of 0 in the H-matrix is represented by an edge that connects a check node and a variable node to each other. In the non-binary LDPC code, message information corresponding to the edge is represented in a vector form.

A non-binary GF(q=4) LDPC decoding process will be described below.

An input message vector for a first symbol received from a decoder denotes "L1={Probability[0], Probability[1], Probability[α], Probability[α2]}", an input message vector for a second symbol denotes "L2 ={Probability[0], Probability[1], Probability[α], Probability[α2]}", and an input message vector for an Nth symbol denotes "LN={Probability[0], Probability[1], Probability[α], Probability[α2]}". A general decoding method corresponds to a scheme of gradually improving information received through repeated decoding processes between variable nodes and check nodes. An error correction method according to various embodiments of the present disclosure provides a method and apparatus for reducing the amount of calculation using fewer configuration sets than that of the related art in a check node decoding process and improving an error correcting ability.

FIGS. 5A and 5B illustrate a process of selecting a node that constitutes a configuration set using a check node input message of a typical technology according to various embodiments of the present disclosure.

In FIG. 5A, V1, V2, and V3 denote respective check node input vector messages. Values of the vector message V1, V2, and V3 denote reliability values corresponding to a GF(q=4) element. Here, a message value "0" 510 denotes one having the highest reliability among V1, V2, and V3. In FIG. 5B, "GF(q=4) element=0" is selected from all input vector messages V1, V2, and V3 as indicated by reference numeral 520 (In FIG. 5B, the selected "GF(q=4) element=0" is represented by a rectangle. Further, in elements except for the "GF(q=4) element=0," two elements having the high reliabilities with respect to the GF(q=4) element are selected and are represented in a rectangular shape as illustrated in FIG. 5B. The selected rectangular shape is a candidate that configures a configuration set.

Figure 6A:
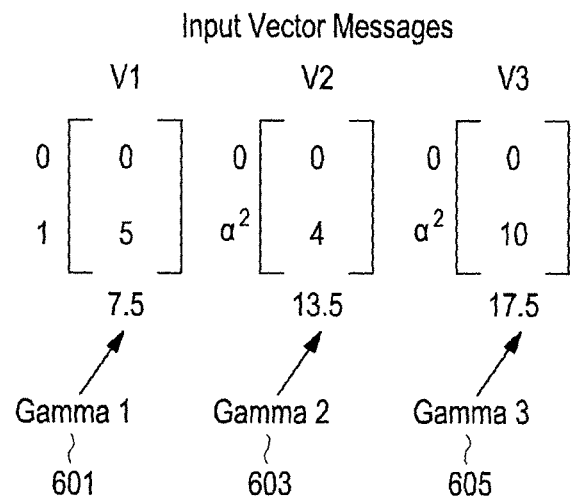
FIGS. 6A and 6B illustrate a method of configuring a configuration set according to various embodiments of the present disclosure.
Figure 6B:
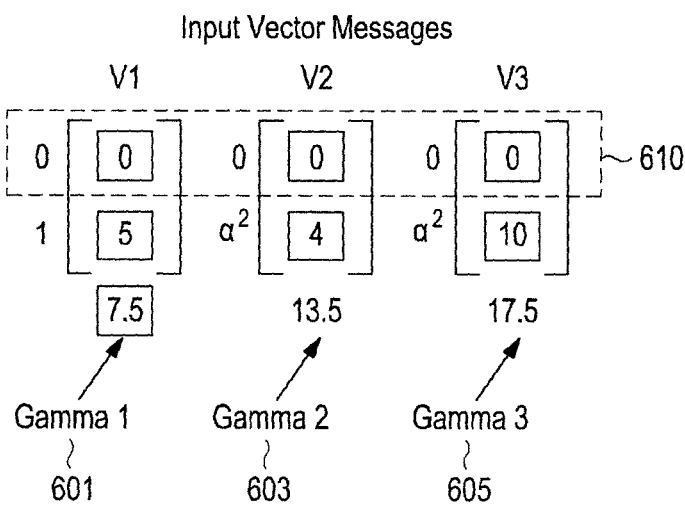

FIGS. 6A and 6B schematically illustrate a method of constituting a configuration set according to various embodiments of the present disclosure.

Although it is disclosed that a decoder performs an overall operation according to various embodiments of the present disclosure and another embodiment of the present disclosure, a receiver (or a terminal) or a controller or a message selection unit performs the overall operation.

As illustrated in FIG. 6A, the message value "0" having the highest reliability value, the message values (5, 4, 10) having the second highest reliability in V1, V2, and V3, and GF(q=4) element (1, α2, α2) corresponding thereto are selected from the input vector messages of FIG. 5A. Further, parts having the highest reliability among not-selected parts are represented by Gamma 1 601, Gamma 2 603, and Gamma 3 605. In FIG. 6A, two message values having the high reliability among respective input vector messages and an average value corresponding thereto are represented by Gamma. Gamma represents an unselected value among the input vector messages and is represented by a value having the highest reliability among unselected messages or a value having the smallest reliability among selected messages.

In FIG. 6B, a decoder selects the message value "0" having the highest reliability in V1, V2, and V3, as indicated by reference numeral 610. Further, as illustrated in FIG. 6B, the decoder selects one message value (5, 4, 10) having the highest reliability with respect to elements except for "GF (q=4) element=0". In various embodiments of the present disclosure, an existent GF element is 1, and α2. Further, the decoder selects a value (Gamma 1) having the highest reliability among Gammas. Finally, as illustrated in FIG. 6B, the selected node is a candidate that configures a reduced configuration set.

FIGS. 7A to 7E illustrate a method of correcting an error in a mobile communication system using a non-binary LDPC code according to various embodiments of the present disclosure.

In various embodiments of the present disclosure, a method of selecting a node having high reliability to configure a reduced configuration set and a method of calculating an extra column output message (which is referred to as an extra output message) and an intermediate check node output message will be described with reference to FIGS. 7A to 7E.

Figures 7A, 7B, 7C:
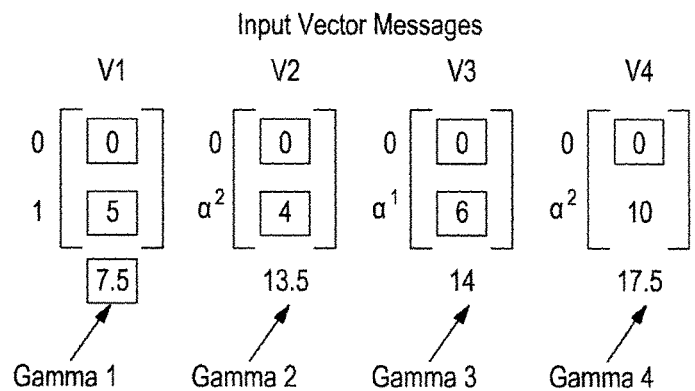

FIG. 7A illustrates input vector messages V1, V2, V3, and V4 according to various embodiments of the present disclosure.

The decoder selects one value having high reliability from each column of the input vector message of FIG. 7A. For example, In FIG. 7A, "5" is selected as a value having high reliability in the first column, "4" is selected as a value having high reliability in the second column, and "6" is selected as a value having high reliability in the third column. Since the configuration set is configured only by a combination in which column indexes do not overlap each other, "10" is not selected as a value having high reliability in the fourth column.

FIG. 7B illustrates the message values (5, 4, 6) having high reliability in the input vector messages V1, V2, V3, and V4, and a node that configures a reduced configuration set by a corresponding GF(q=4) element. The selected nodes configure a reduced configuration set using nodes (GF element 1, α2, α corresponding to the message values 5, 4, and 6) except for "GF(q=4) element=0" as illustrated in FIG. 7C. When the configuration set is configured by a combination of the message values "5" (column index=V1), "6" (column index=V3), and "4" (column index=V2), the combination is configured such that column indexes do not overlap each other. In various embodiments of the present disclosure, the configuration set is configured to be "{5, 6, 4, (5, 6), (5, 4), (6, 4)}". The configuration set changes and generates nm*dc (nm<<q) in a check node input message q*dc (q denotes the size of LLR message, dc denotes a check node degree). nm implies the number of messages or the size of messages.

FIG. 7D represents a message value having the highest reliability with respect to each GF element of FIG. 7C as an extra output message (or an extra column output message). A configuration set corresponding to the corresponding value in the extra output message is {[1, 0, 0 0,], [0, 0, α, 0], [0, α2, 0, 0]}. In the configuration set configuring the extra output message, the GF elements except for a value "0" correspond to the number of deviated symbols. In the extra output message of FIG. 7D, 1) when GF element=0, the number of deviated symbols is 0, 2) when GF element=1, the number of deviated symbols is 1, 3) GF element=α, the number of deviated symbols is 1, and 4) GF element=α2, the number of deviated symbols is 1. In various embodiments of the present disclosure, there is no case where the number of deviated symbols is 2. Except for when the GF element=0, with regard to a ratio of when the number of deviated symbols is 1 to when the number of deviated symbols is 2, the case where the number of deviated symbols is 1 has 100% distribution.

FIG. 7E illustrates an intermediate check node output message value generated using the reduced configuration set (FIG. 7C) and the extra output message value (FIG. 7D) according to various embodiments of the present disclosure.

Message values corresponding to the GF element 0 among the output message vectors V1, V2, V3, and V4 are zero. An output message vector value except for GF element 0 calculates an intermediate check node output message value using 1) the GF element and the deviated symbol information of the previously-calculated configuration set, and 2) the first or second reliability (FIG. 7A) values of the GF element except for zero in the input message vector V1, V2, V3, and V4.

Figure 8:
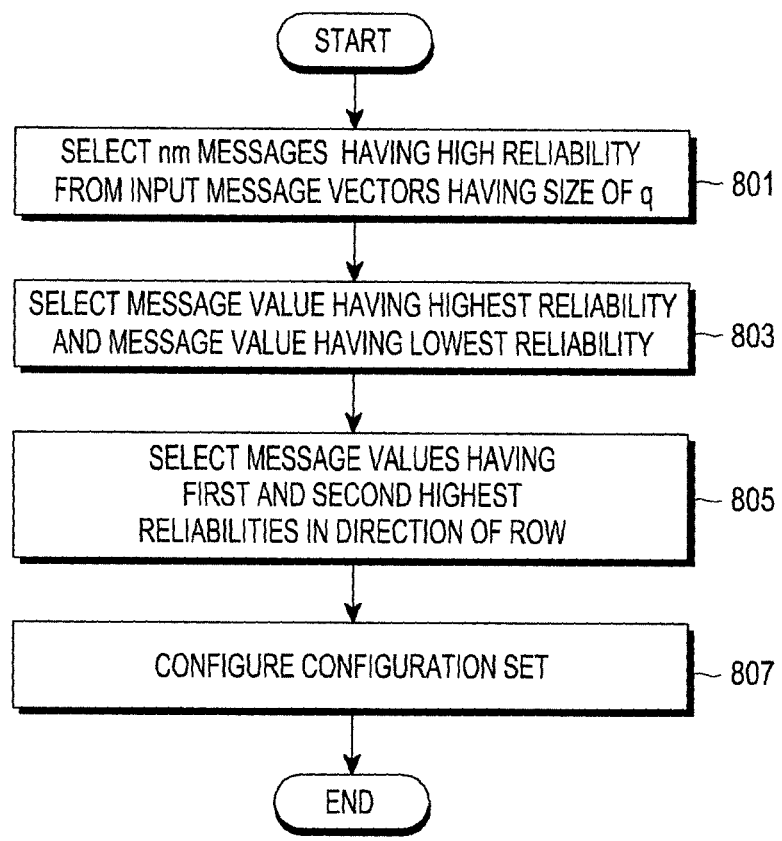
FIG. 8 illustrates a process of generating a reduced configuration set according to various embodiments of the present disclosure.

FIG. 8 illustrates a process of generating a reduced configuration set according to various embodiments of the present disclosure.

In step 801, a decoder selects nm message vectors having high reliability from an input message vector having the size of q. In step 803, the decoder selects a message value (field element corresponding thereto) having the highest reliability and a message value having the lowest reliability among the selected nm message vectors having the size of q. A part having the lowest reliability is represented to be Gamma of FIG. 7B. In general, Gamma is represented as a message value having the lowest reliability among the selected nm messages as in the flowchart of FIG. 8. Further, Gamma is substituted for a value (an average value of q+an offset value) for selecting the nm message values as in the example of FIG. 7B. In step 805, the decoder selects a message value having high first reliability in a direction of a row (in a GF(q) direction) from the selected nm message vectors having the size of q or selects a message value having high first and second reliabilities in the direction of a row (in a GF(q) direction) from the selected nm message vectors. The methods of step 805 are selectively used. In step 807, the decoder configures a reduced configuration set using the message value having high first reliability, which is selected in step 805. When the reduced configuration set is configured, the configuration set is configured by a combination in which column indexes corresponding to the selected message value having high first reliability do not overlap each other.

Figure 9:
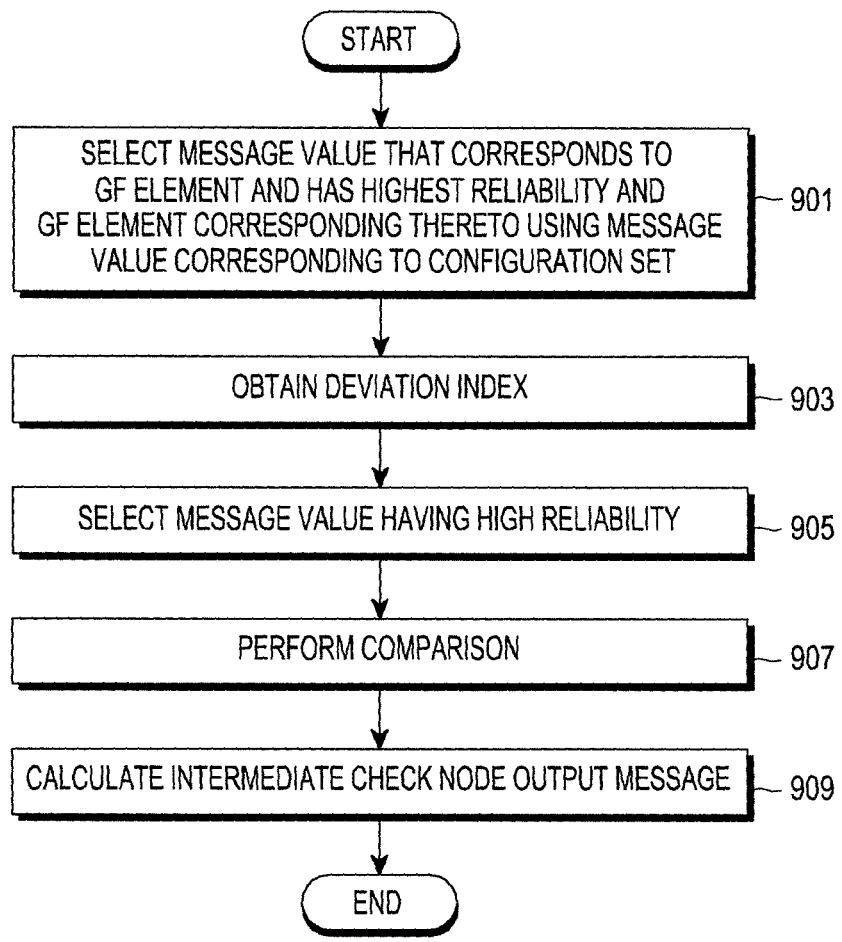
FIG. 9 illustrates a method of generating a check node output message using the reduced configuration set generated in FIG. 8 according to various embodiments of the present disclosure.

FIG. 9 illustrates a method of generating a check node output message using the reduced configuration set generated in FIG. 8 according to various embodiments of the present disclosure.

In step 901, a decoder selects a message value that corresponds to a GF element and has the highest reliability, and a GF element, corresponding thereto, uses a message value corresponding to the reduced configuration set. For example, in FIG. 7C, in a message value corresponding to a case where GF element=1, a value of 5 having the highest reliability is selected from values 5 and 10, and accordingly, configuration [1 0 0 0] is selected. In step 903, the decoder searches the selected configuration [1 0 0 0] for a deviation index having a value of 1. The deviation index is located on a column of a part having a value of not 0. In step 905, the decoder searches for a value equal to that of a GF element of a configuration set and compares the searched configurations with a deviation index to select a value having the highest reliability among the corresponding message values. For example, since a column index corresponding to when the GF element in the extra output message is 1, configuration sets, in which the GF element=1, among the corresponding set (FIG. 7C) are [1, 0, 0, 0] and [0, α2, α, 0]. The configuration set, in which GF element=0 at a part where column index=1, is [0, α2, α, 0], and a message value corresponding thereto is 10. In step 907, the decoder compares the message value selected in step 805 of FIG. 8 with the value having the first highest reliability or the value having the second highest reliability, which is selected in step 905 of FIG. 9. In step 909, the decoder calculates an intermediate check node output message. Output messages corresponding to a location of a column in addition to the deviation index of the extra output message are identical to an extra output message value.

Figure 10:
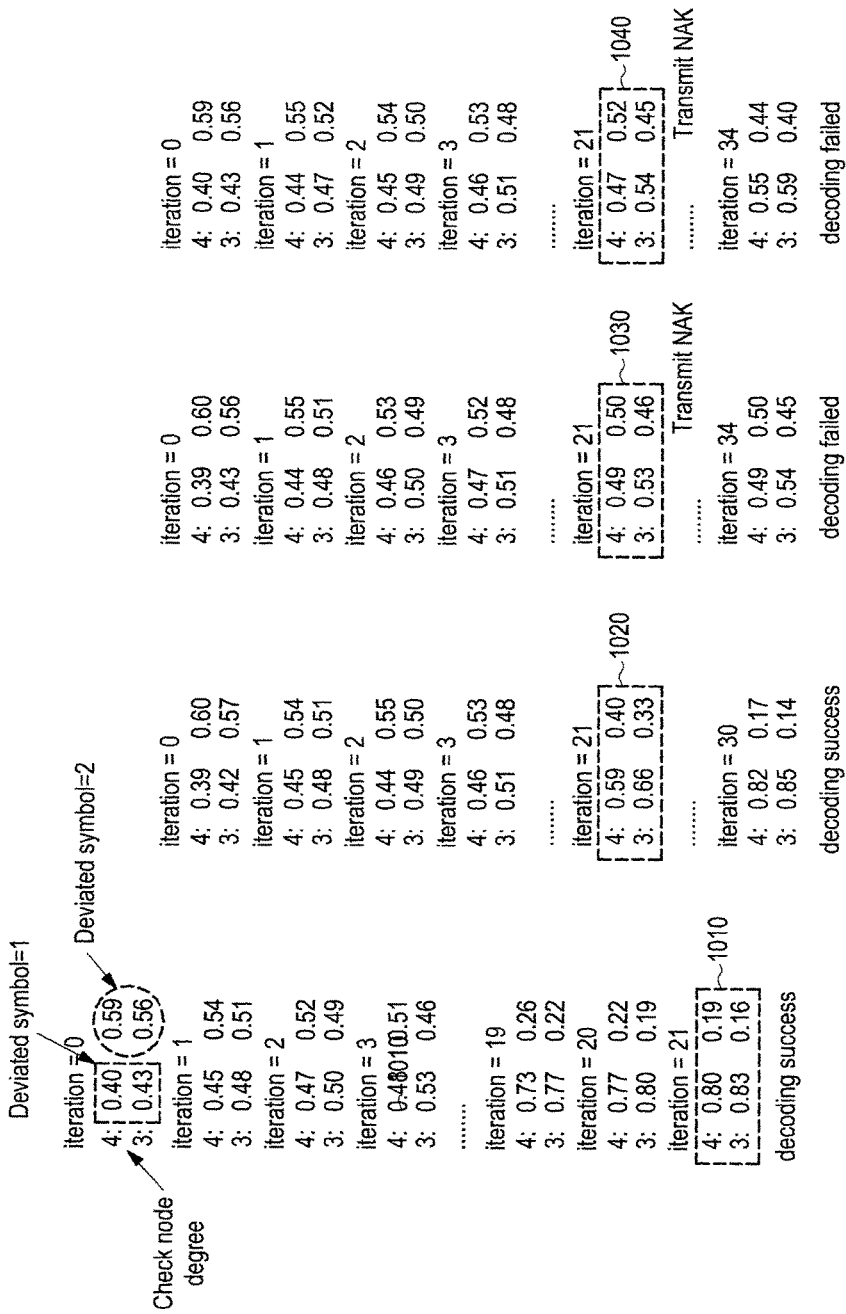
FIG. 10 illustrates a method of previously determining a decoding failure decision in a deviated symbol ratio before the maximum number of times of repeated decoding so as to decrease decoding time according to various embodiments of the present disclosure.

FIG. 10 illustrates a method of previously determining a decoding failure decision in a deviated symbol ratio before the maximum number of times of repeated decoding so as to decrease decoding time according to various embodiments of the present disclosure.

A frame in which the decoding failure occurs is not subjected to decoding for the remaining iteration number that is times of iterations by a decoding evasion method, and a receiver is used for a method for transmitting a Negative ACKnowledgment (NACK) signal to the transmitter. A time point when the decoding failure is determined is determined on the basis of the number of times of repeated decoding. As illustrated in FIG. 10, the decoding failure criterion is represented as an example where the number of times of decoding (iteration=21) is 21 (the maximum number of times of repeated decoding is assumed to be 35).

Figure 11:
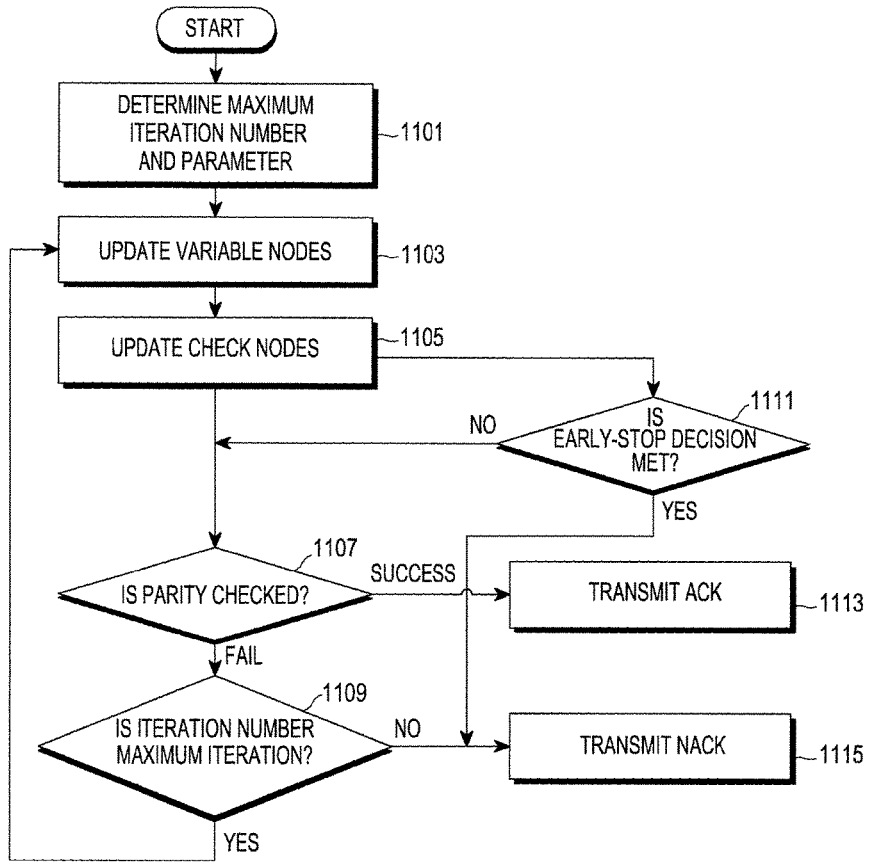
FIG. 11 illustrates a method of determining a decoding failure decision according to various embodiments of the present disclosure.

FIG. 11 illustrates a method of determining a decoding failure decision according to various embodiments of the present disclosure.

In step 1101, a decoder determines the maximum number of times and a parameter for an early-stop decision rule. In step 1103, the decoder updates a variable node. In step 1105, the decoder updates a check node. In step 1107, the decoder checks parity. In step 1113, when it is determined on the basis of the checked parity that the decoding succeeds, the decoder transmits an ACK signal to a transmitter. In step 1109, when it is determined on the basis of the checked parity that the decoding fails, the decoder determines whether the iteration number is smaller the maximum iteration number. When the iteration number is smaller than the maximum iteration number, the process proceeds to step 1103 to update a variable node. However, when the iteration number is larger than or equal to the maximum iteration number, the decoder transmits a NACK message to the transmitter, in step 1115.

In step 1111, after the check node is updated, the decoder determines whether the early-stop decision is satisfied. In step 1115, when the early-stop decision is satisfied, the decoder transmits a NACK message. When a ratio of the number of deviated symbols is 2 increases in the check node (when the early-stop decision is satisfied), the decoding is not performed by the remaining iteration number and the receiver transmits a NACK signal to the transmitter.

When the early-stop decision is not satisfied, the decoder proceeds to step 1107 to check parity.

Figure 12:
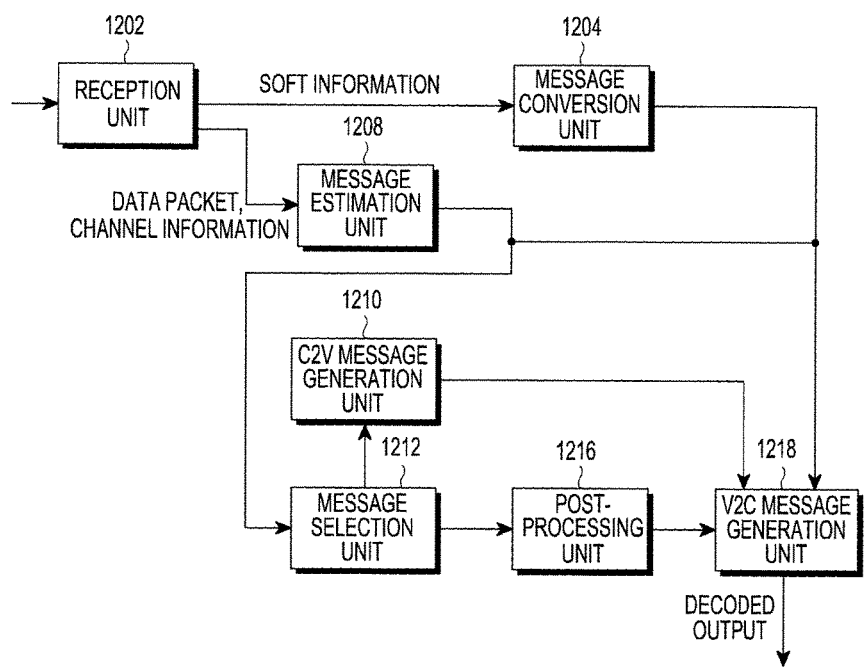
FIG. 12 illustrates a decoder structure including a non-binary LDPC decoding method according to various embodiments of the present disclosure.

FIG. 12 illustrates a decoder structure including a non-binary LDPC decoding method according to various embodiments of the present disclosure.

The non-binary LDPC code decoder of the present disclosure includes a reception unit 1202, a message estimation unit 1208, a message conversion unit 1204, a message selection unit 1212, a check node message generation unit 1210, a variable node message generation unit 1218, a post-processing unit 1216, etc.

The reception unit 1202 receives a signal transmitted from a transmitter.

The message estimation unit 1208 estimates the received message using a received packet, channel information, and distribution (average or variance) of respective message vectors.

The message conversion unit 1204 selects a message value having the highest reliability in each of the message vectors (in each column of an input vector message) from soft information determined by the reception unit 1202 and transmits the result value to the message estimation unit 1208 and the variable node message generation unit 1218.

The message selection unit 1212 performs an operation of generating a configuration set using the message value selected for each column and the GF element corresponding to the message value as well as an operation of selecting a message generated in FIGS. 8 and 9 according to various embodiments of the present disclosure. Further, when the message conversion unit 1204 selects a node having high reliability, the message selection unit 1212 configures the reduced configuration set as illustrated in FIG. 7C and calculates an intermediate check node output message using the configuration set and the extra column output message.

An output message of the check node message generation unit 1210 is expressed as a C2V message, and an output message of the variable node message generation unit 1218 is expressed as a V2C message.

The variable node message generation unit 1218 generates a variable node output message, and the post-processing unit 1216 post-processes a message selected by the message selection unit 1212.

The check node message generation unit 1210 generates a check node output message.

It will be appreciated that the error correction apparatus and method in a mobile communication system using a non-binary LDPC code according to various embodiments of the present disclosure are implemented in the form of hardware, software, or a combination of hardware and software. Any such software is stored, for example, in a volatile or non-volatile storage device such as a ROM, a memory such as a RAM, a memory chip, a memory device, or a memory IC, or a recordable optical or magnetic medium such as a CD, a DVD, a magnetic disk, or a magnetic tape, regardless of its ability to be erased or its ability to be re-recorded. It will be appreciated that the error correction method in a mobile communication system using a non-binary (LDPC) code according to various embodiments of the present disclosure are implemented by a computer or portable terminal including a controller and a memory, and the memory is an example of a machine-readable storage medium suitable for storing a program or programs including instructions that implement embodiments of the present disclosure.

Accordingly, the present disclosure includes a program for a code implementing the apparatus and method described in the appended claims of the specification and a machine (a computer or the like)-readable storage medium for storing the program. Further, the program is electronically transferred by a predetermined medium such as a communication signal transferred through a wired or wireless connection, and the present disclosure appropriately includes equivalents of the program.

Further, in a mobile communication system using a non-binary LDPC code according to various embodiments of the present disclosure, an error correction apparatus receives and stores the program from a program provision apparatus wiredly or wirelessly connected thereto. The program provision apparatus includes: a program including indications for performing an error correction method in a mobile communication system using a non-binary LDPC code in which the program processing apparatus is configured in advance; a memory for storing information, etc. required for the error correction method in the mobile communication system using the non-binary LDPC code; a communication unit for performing wired or wireless communication with the graphic processing apparatus; and a controller for transmitting the corresponding program to the transmission/reception device automatically or according to a request from the graphic processing apparatus.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A decoding method in a mobile communication system using a non-binary low density parity-check (LDPC) code, the decoding method comprising:

estimating an input vector message from a received signal;

selecting message values from the input vector message by rows in consideration of reliability of the message values;

selecting a message value including a highest reliability from the selected message values of the input vector message by columns;

generating a configuration set using the message value selected by columns and a galois field (GF) element corresponding to the message value;

determining a number of deviated symbols based on GF elements in the configuration set except for a value corresponding to the GF element that is equal to 0; and generating a check node output message to the received signal using the generated configuration set and the number of deviated symbols, wherein the configuration set is configured such that a column index value of each of the input vector message do not overlap with each other.

2. The decoding method of claim 1, wherein the configuration set is configured using a message selected in consideration of a reliability value of the input vector message and a representative value that is not selected.

3. The decoding method of claim 1, wherein the check node output message is selected as a message including high reliability by selecting a deviated symbol corresponding to the configuration set required for a check node.

4. The decoding method of claim 1, further comprising determining a time point when decoding fails on a basis of the configuration set.

5. The decoding method of claim 4, wherein the basis of the configuration set is a maximum number of iterations.

6. The decoding method of claim 5, further comprising, when decoding failure of the input vector message is determined when an iteration count is larger than or equal to the maximum number of iterations, transmitting a NACK message to a transmitter.

7. The decoding method of claim 1, further comprising determining a time point when decoding fails on a basis of a decoding-successful deviated symbol distribution value.

8. The decoding method of claim 1, further comprising, when decoding failure of the input vector message is determined using at least one of the configuration set and a decoding-successful deviated symbol distribution value, transmitting a NACK message to a transmitter.

9. The decoding method of claim 1, further comprising determining a time point when decoding fails on a basis of at least one of a modulation order and a deviated symbol distribution value ratio according to a GF(q) non-binary LDPC code order.

10. The decoding method of claim 1, wherein the configuration set is configured by selecting more messages than messages at a time of retransmission.

11. A decoding apparatus in a mobile communication system using a non-binary low density parity-check (LDPC) code, the decoding apparatus comprising:

a transceiver configured to estimate an input vector message from a received signal;

a processor configured to:

select message values from the input vector message by rows in consideration of reliability of the message values, select a message value including a highest reliability from the selected message values of the input vector message by columns;

generate a configuration set using the message value selected by columns and a galois field (GF) element corresponding to the message value;

determine a number of deviated symbols based on GF elements in the configuration set except for a value corresponding to the GF element that is equal to 0; and generate a check node output message to the received signal using the generated configuration set and the number of deviated symbols, wherein the configuration set is configured such that a column index value of each of the input vector message do not overlap with each other.

12. The decoding apparatus of claim 11, wherein the configuration set is configured using a message selected in consideration of a reliability value of the input vector message and a representative value that is not selected.

13. The decoding apparatus of claim 11, wherein the check node output message is selected as a message including high reliability by selecting a deviated symbol corresponding to the configuration set required for a check node.

14. The decoding apparatus of claim 11, wherein the decoding apparatus is further configured to determine a time point when decoding fails on a basis of the configuration set.

15. The decoding apparatus of claim 14, wherein the basis of the configuration set is a maximum number of iterations.

16. The decoding apparatus of claim 15, further comprising, when decoding failure of the input vector message is determined when an iteration count is larger than or equal to the maximum number of iterations, transmitting a NACK message to a transmitter.

17. The decoding apparatus of claim 11, wherein the decoding apparatus is configured to determine a time point when decoding fails on a basis of a decoding-successful deviated symbol distribution value.

18. The decoding apparatus of claim 11, further comprising a transmission unit configured to transmit a NACK message to a transmitter when decoding failure of the input vector message is determined using at least one of the configuration set and a decoding-successful deviated symbol distribution value.

19. The decoding apparatus of claim 11, wherein the decoding apparatus is configured to determine a time point when decoding fails on a basis of at least one of a modulation order and a deviated symbol distribution value ratio according to a GF(q) non-binary LDPC code order.

20. The decoding apparatus of claim 11, wherein the configuration set is configured by selecting more messages than messages at a time of retransmission.

* * * * *